United States Patent
Moss et al.

(10) Patent No.: US 6,917,561 B2
(45) Date of Patent: Jul. 12, 2005

(54) MEMORY CONTROLLER AND METHOD OF ALIGNING WRITE DATA TO A MEMORY DEVICE

(75) Inventors: Robert W. Moss, Longmont, CO (US); Peter Korger, Frederick, CO (US)

(73) Assignee: LSI Logic Corporation, Milpitas, CA (US)

( * ) Notice: Subject to any disclaimer, the term of this patent is extended or adjusted under 35 U.S.C. 154(b) by 576 days.

(21) Appl. No.: 10/134,957

(22) Filed: Apr. 29, 2002

(65) Prior Publication Data

US 2003/0204763 A1 Oct. 30, 2003

(51) Int. Cl.⁷ .................................................. G11C 8/00
(52) U.S. Cl. ..................................... 365/233; 365/194
(58) Field of Search ............................. 365/233, 233.5, 365/194

(56) References Cited

U.S. PATENT DOCUMENTS 5,764,591 A * 6/1998 Matsui et al. ............. 365/233.5
6,370,067 B1 * 4/2002 Ko et al. ..................... 365/194
6,839,301 B2 * 1/2005 Lin et al. ..................... 365/233

* cited by examiner

Primary Examiner—Tan T. Nguyen
(74) Attorney, Agent, or Firm—Westman, Champlin & Kelly

(57) ABSTRACT

A memory controller for aligning write data and a clock strobe signal provided to a memory device includes a delay line coupled to a local clock input and providing as an output a delayed local clock signal. A first latch circuit receives data to be written to the memory device as an input and has an output coupled to a data input of the memory device. The first latch circuit is clocked by a first one of the local clock signal and the delayed local clock signal and provides in response the write data to the data input of the memory device. A clock strobe generating circuit is clocked by a second one of the local clock signal and the delayed local clock signal. The clock strobe generating circuit has an output coupled to a clock strobe input of the memory device and provides the clock strobe signal to the memory device.

20 Claims, 1 Drawing Sheet

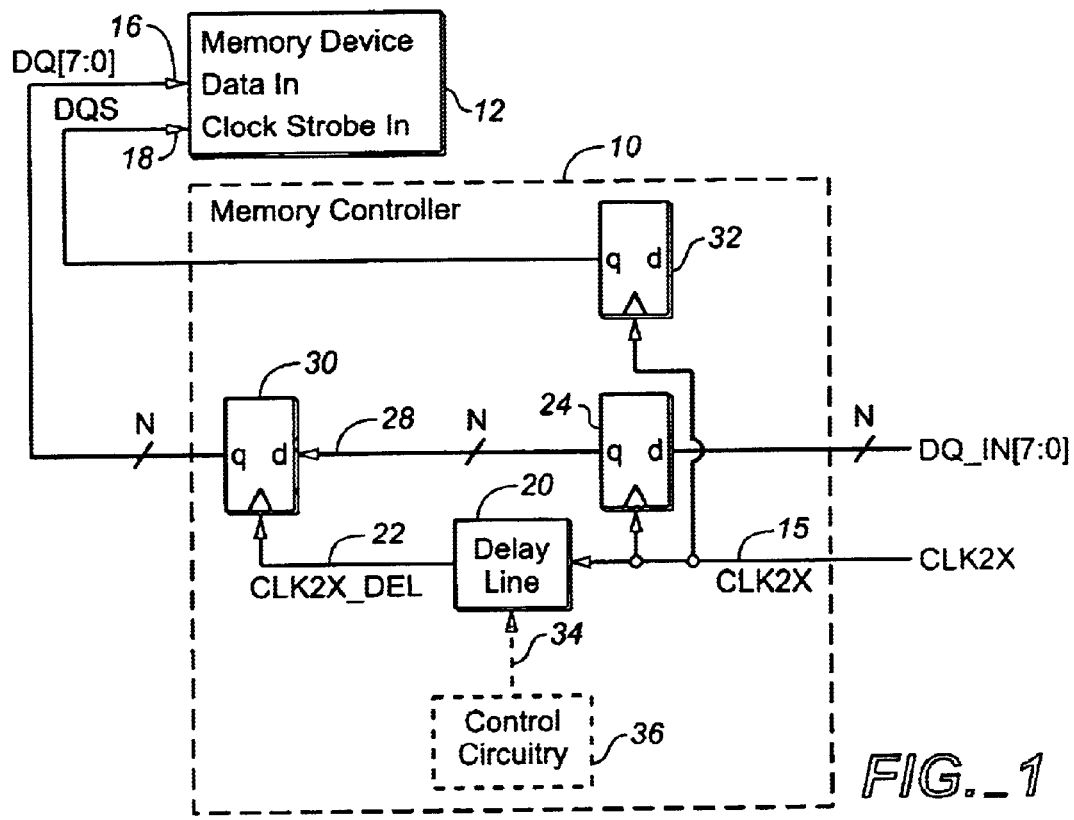
FIG._1
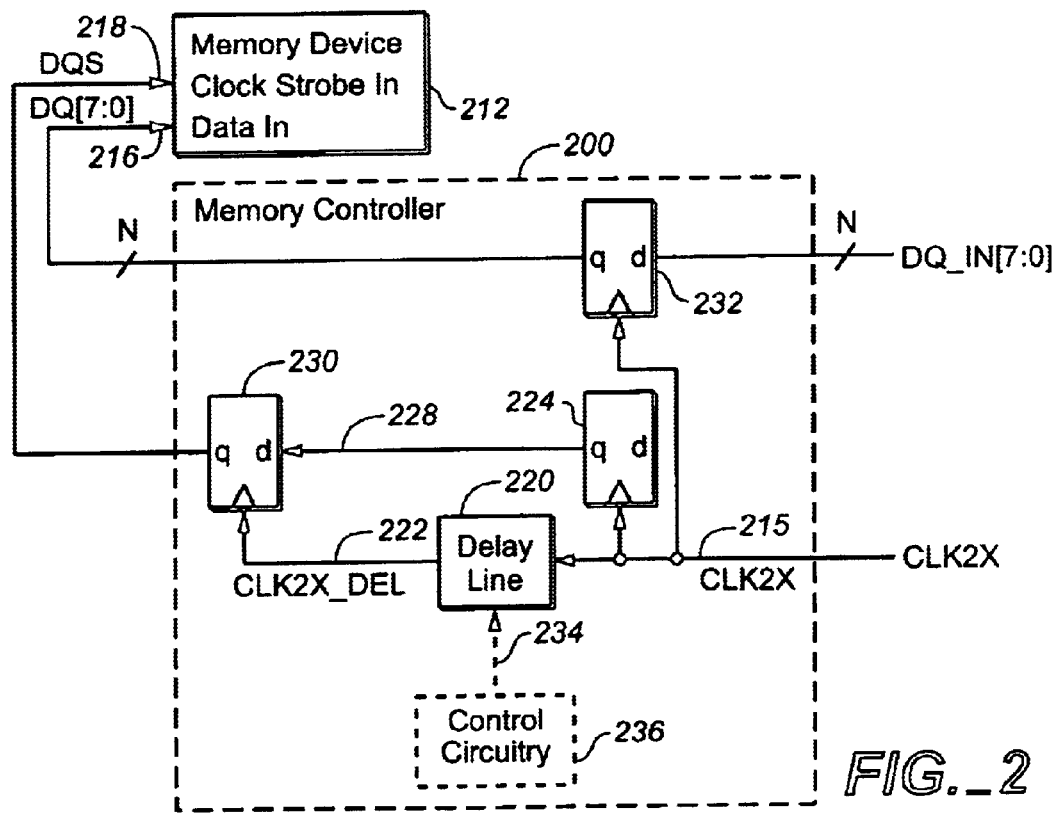
FIG._2

MEMORY CONTROLLER AND METHOD OF ALIGNING WRITE DATA TO A MEMORY DEVICE

FIELD OF THE INVENTION

The present invention relates to memory controllers. More particularly, the present invention relates to memory controllers and methods of aligning write data provided to a memory device, where the data is aligned with respect to a data clock strobe signal that is generated from the memory controller.

BACKGROUND OF THE INVENTION

Certain types of memory devices require a clock strobe signal having edges that are aligned with the center of changes in the write data. A double data rate (DDR) dynamic random access memory (DRAM) registers data on each rising and falling edge of the clock strobe signal. A DDR DRAM therefore accepts or registers two data words per clock cycle.

A memory controller is often used to coordinate the transfer of data to and from a memory device, such as a DDR DRAM. The memory controller provides a clock strobe signal to the memory device for synchronizing write operations. The memory device uses the clock strobe signal for determining when the write data is valid and can therefore be latched. As mentioned, data to a DDR DRAM transitions twice per clock period. Ideally, data to a DDR DRAM transitions with a ¼ clock phase shift from the data clock strobe as measured at the memory device. The memory controller is responsible for creating this phase shift with appropriate timing to insure correct operation of the memory device. In previous controllers, the controller has used a clock signal having two times (2x) the frequency of a system clock signal. A current approach to creating the desired phase shift is to invert the 2x clock signal, and to use the falling edge of the inverted 2x clock as the event that transitions write data to the memory device. This approach can have certain limitations and/or can necessitate added circuit complexity.

Clock generation circuits, such as oscillators or phase locked loops (PLLs), coupled with asymmetries introduced by clock tree routing, do not provide a uniform duty cycle (i.e., the time that the clock signal is observed as being high is different than the time the clock signal is observed as being low). When a uniform duty cycle is important, a clock of twice the desired frequency (i.e., the 2x clock) may be used and divided by two to create a symmetrical clock. In the case of DDR DRAM, this would require the generation and distribution of a 4x clock, which is not desirable due to the high frequencies involved. If an asymmetrical duty cycle 2x clock is used to align the write data, the operational frequency of the memory can be limited and the resulting system will have less margin surrounding timing of write data with respect to the data clock strobes. Improved memory controller circuits are therefore desired that are capable of aligning write data provided to a memory device, with respect to a data clock strobe signal that is generated from the memory controller, without one or more of the aforementioned limitations or requirements.

SUMMARY OF THE INVENTION

A memory controller for aligning write data and a clock strobe signal provided to a memory device includes a delay line coupled to a local clock input and providing as an output a delayed local clock signal. A first latch circuit receives data to be written to the memory device as an input and has an output coupled to a data input of the memory device. The first latch circuit is clocked by a first one of the local clock signal and the delayed local clock signal and provides in response the write data to the data input of the memory device. A clock strobe generating circuit is clocked by a second one of the local clock signal and the delayed local clock signal. The clock strobe generating circuit has an output coupled to a clock strobe input of the memory device and provides the clock strobe signal to the memory device. The delay, between the local clock signal and the delayed local clock signal, introduced by the delay line aligns transitions in the data provided to the data input of the memory device and transitions in the clock strobe provided to the memory device without the need for inversion of the local clock signal and precise control of the duty cycle of the local clock signal.

In some embodiments of the invention, the delay line is a programmable delay line, while in other embodiments the delay line is a fixed (non-programmable) delay line.

In some embodiments of the present invention, the memory device is a double data rate (DDR) dynamic random access memory (DRAM) device, but the memory controller of the invention can be used to align write data and a clock strobe for other types of memory devices as well.

In some embodiments of the present invention, the memory controller circuit delays the clock strobe with respect to the data, rather than the data with respect to the clock strobe, thereby also creating the desired phase shift.

BRIEF DESCRIPTION OF THE DRAWINGS

FIG. 1 is a schematic diagram of a portion of a memory controller coupled to a memory device according to one embodiment of the present invention.

FIG. 2 is a schematic diagram of a portion of a memory controller coupled to a memory device according to a second embodiment of the present invention.

DETAILED DESCRIPTION OF ILLUSTRATIVE EMBODIMENTS

FIG. 1 is a schematic diagram of a memory controller 10 coupled to a memory device 12 according to one embodiment of the present invention. Memory controller 10 has an internal local clock signal CLK2X, which is used for synchronizing various functions within the memory controller including the capture of data received from memory device 12 and for synchronizing read and write operations within memory device 12. Internal local clock signal CLK2X is, in some embodiments, a clock signal having twice the frequency as a system clock signal CLK. Typically, the 1X system clock signal CLK is generated from the 2X clock signal CLK2X, though the opposite could also be true in some embodiments.

In some embodiments of the invention, memory device 12 is a double data rate (DDR) dynamic random access memory (DRAM). In the example shown in FIG. 1, memory device 12 includes an N bit data input 16 labeled "DQ[7:0]" and a data clock strobe input 18 labeled "DQS". Using typical DDR DRAM memory devices, N is equal to 4, 8 or 32 bits, but the invention is not limited to these values of N. Memory device 12 receives data DQ[7:0], at input 16, which needs to be aligned with a data clock strobe DQS received by the memory device at input 18. For the maximum amount of margin in a system and the highest operating frequency, DQ[7:0] should be aligned such that it transitions in the middle of the stable region of the DQS strobe, though transitions other than in the middle of the stable region of the DQS strobe may also be desirable.

In the embodiment illustrated in FIG. 1, memory controller 10 includes a delay line 20 and latches 24, 30 and 32. In some embodiments, delay line 20 is a programmable delay line having a plurality of propagation delay settings that are programmable through delay control input 34. However, in other embodiments, delay line 20 has a fixed or non-programmable delay. Latches 24 and 30 can be N bit latches for latching N bit data through to provide data DQ[7:0] at input 16 of memory device 12. In one embodiment, latches 24, 30 and 32 include D-type flip-flops which latch data on the rising edges of the clock signals applied to the latches. Other types of latches can be used in other alternative embodiments.

FIG. 1 illustrates only portions of memory controller 10 which are useful in explaining the concepts of the invention, and components other than those shown can be included in memory controller 10. Further, the particular components shown in FIG. 1 can be replaced with other components and configurations without departing from the invention. Also, other illustrated components are optional. For example, control circuitry 36 can optionally be included in memory controller 10 to provide the delay control input 34. However, in other embodiments, delay control input 34 can be a fixed value programmed into delay line 20 and control circuitry 36 can be omitted. In yet other embodiments, no delay control input is required.

The clock signal CLK2X is used to clock latch 32 to create a symmetrical clock strobe DQS at input 18 to memory device 12. The same clock signal CLK2X is used to clock latch 24 in order to latch N bit input data (labeled DQ[7:0]_IN) to N bit output 28. Clock signal CLK2X that is used to create the symmetrical DQS is delayed using programmable delay line 20 to create at output 22 a delayed clock CLK2X_DEL such that the delay between CLK2X and CLK2X_DEL is optimized. In some embodiments, the delay for the system is optimized by setting it to ¼ of a system clock period (½ of a CLK2X period). Though in typical cases the delay setting will be ¼ of the system clock period, it is not a requirement of the invention that the delay be set to ¼ of the system clock period. In fact, in can be advantageous to factor the optimal setup and hold time into this delay setting, as well as factoring in clock rise/fall asymmetries. Delayed clock signal CLK2X_DEL is used to clock latch 30 in order to latch the N bit data 28 to data DQ[7:0] at input 16 of memory device 12.

The delay between clock signal CLK2X and delayed clock signal CLK2X_DEL may be adjusted using delay control input 34 for a more optimal value such that the delay results in DQ[7:0] transitioning in the middle of the stable region of the DQS strobe at memory device 12, rather than at the signal's origin within the memory controller. In order to accurately set the delay line to a fixed percentage of a clock period, the delay line may need to be calibrated or alternatively used with a master digital locked loop (DLL) that would allow the delay to be scaled with respect to a fixed clock period. In such embodiments, the DLL can be considered to be part of control circuitry 36.

In the conventional approach which is not utilized in memory controller 10 of the present invention, alignment of clock strobe DQS with data DQ[7:0] would be accomplished by inverting clock signal CLK2X and using this inverted clock signal to latch the write data to the memory device. Then, the rising edge of this inverted clock signal would be used to register the data. This can require more precise control over the duty cycle of clock signal CLK2X. Using delay line 20 to align data DQ[7:0] with clock strobe signal DQS minimizes the necessity to maintain precise control over this duty cycle. Use of delay line 20 in this manner does not require the use of both edges of the clock signal, relying solely on the rising edge.

In summary, the present invention includes a memory controller 10 for aligning write data DQ[7:0] and a clock strobe signal DQS provided to a memory device 12. The memory controller includes a local clock input 15 providing a local clock signal CLK2X. The memory controller also includes a delay line 20 coupled to the local clock input and providing as an output a delayed local clock signal CLK2X_DEL. A first latch circuit 30 receives data to be written to the memory device as an input and has an output coupled to the data input 16 of the memory device. The first latch circuit is clocked by a first one of the local clock signal CLK2X and the delayed local clock signal CLK2X_DEL and provides in response the write data DQ[7:0] to the data input of the memory device. In the illustrated embodiment, first latch circuit 30 is clocked using the delayed local clock signal CLK2X_DEL, but the opposite could be true in other embodiments. A clock strobe generating circuit 32 is clocked by the second (or other) one of the local clock signal and the delayed local clock signal. In the illustrated embodiment, circuit 32 is clocked using local clock signal CLK2X, but again the opposite could be true. The clock strobe generating circuit 32 has an output coupled to a clock strobe input 18 of the memory device 12 and provides the clock strobe signal to the memory device.

FIG. 2 is a schematic diagram of a second embodiment of the memory controllers of the present invention as discussed above. Memory controller 200 can include components which are substantially identical to those shown in memory controller 10 of FIG. 1. In FIG. 2, components of memory controller 200 are labeled with reference numbers which correspond in their last two digits to reference numbers of corresponding components in FIG. 1. A primary difference between memory controller 200 and memory controller 10 is that, in memory controller 200, input data DQ[7:0]_IN is provided to latch 232 (corresponding to latch 32 in FIG. 1), instead of to latch 224 (corresponding to latch 24 in FIG. 1). Thus, in this embodiment, latch 232 can serve as the first latch circuit, while latches 224 and/or 230 can serve as the clock strobe generating circuit. Note that the data input 216 of memory device 212, which receives data DQ[7:0], is coupled to latch 232 in this embodiment. Likewise, data clock strobe input 218, which receives clock strobe DQS, is coupled to the output of latch 230. As a result, the delay line 220 is used to delay clock strobe DQS with respect to data DQ[7:0], rather than the data with respect to the clock strobe, thereby also creating the desired phase shift.

Although the present invention has been described with reference to preferred embodiments, workers skilled in the art will recognize that changes may be made in form and detail without departing from the spirit and scope of the invention. For example, the memory controller can be used with any memory device (or register) where the write data is aligned with respect to a clock strobe that originates from the memory controller. Further, the invention is not limited to the particular arrangement of latches shown in FIG. 1. More generally, the invention is directed to memory controllers in which a clock strobe provided to the memory device must be aligned with the write data to be stored. In addition, the term "coupled" used in the specification and the claims can include a direct connection and a connection through one or more intermediate components.

What is claimed is:

1. A memory controller for aligning write data and a clock strobe signal provided to a memory device, the memory controller comprising:

a local clock input providing a local clock signal;

a delay line coupled to the local clock input and providing as an output a delayed local clock signal;

a first latch circuit receiving data to be written to the memory device as an input and having an output coupled to a data input of the memory device, the first latch circuit being clocked by a first one of the local clock signal and the delayed local clock signal and providing in response the write data to the data input of the memory device; and a clock strobe generating circuit which is clocked by a second one of the local clock signal and the delayed local clock signal, the clock strobe generating circuit having an output coupled to a clock strobe input of the memory device and providing the clock strobe signal to the memory device.

2. The memory controller of claim 1, wherein the delay line provides the delayed local clock signal such that it is delayed relative to the local clock signal by one half of a period of the local clock signal.

3. The memory controller of claim 1, wherein the delay line is a programmable delay line having a plurality of propagation delay settings that are programmable through a delay control input.

4. The memory controller of claim 3, and further comprising a control circuit which generates the delay control input provided to the programmable delay line to control an amount of delay between the local clock signal and the delayed local clock signal.

5. The memory controller of claim 1, wherein the delay line is a fixed delay line.

6. The memory controller of claim 1, wherein the programmable delay line provides the delayed local clock signal such that it is delayed relative to the local clock signal by an amount which causes write data at the data input of the memory device to transition at a middle of a stable region of the clock strobe at the clock strobe input of the memory device.

7. The memory controller of claim 1, wherein the programmable delay line provides the delayed local clock signal such that it is delayed relative to the local clock signal by an amount which optimizes placement of transitions of the clock strobe signal with respect to transitions in the write data to meet setup and hold time requirements at the memory device.

8. The memory controller of claim 1, and further comprising a second latch circuit receiving the data to be written to the memory device as an input and having an output coupled to the input of the first latch circuit, the second latch circuit being clocked by the second one of the local clock signal and the delayed local clock signal.

9. The memory controller of claim 1, wherein the memory device is a double data rate (DDR) dynamic random access memory (DRAM) device.

10. The memory controller of claim 1, wherein the first latch circuit is clocked by the delayed local clock signal and the clock strobe generating circuit is clocked by the local clock signal to thereby delay the write data provided to the memory device relative to the clock strobe signal provided to the memory device.

11. The memory device of claim 1, wherein the first latch circuit is clocked by the local clock signal and the clock strobe generating circuit is clocked by the delayed local clock signal to thereby delay the clock strobe signal provided to the memory device relative to the write data provided to the memory device.

12. A method of aligning write data and a clock strobe signal provided to a memory device by a memory controller, the method comprising:

providing a local clock signal;

delaying the local clock signal using a delay line to generate a delayed local clock signal;

clocking a first latch circuit with a first one of the local clock signal and the delayed local clock signal to provide the write data to a data input of the memory device; and clocking a strobe generating circuit with a second one of the local clock signal and the delayed local clock signal to provide the clock strobe signal to a clock strobe input of the memory device.

13. The method of claim 12, wherein delaying the local clock signal using the delay line further comprises delaying the local clock signal using a programmable delay line having a plurality of propagation delay settings that are programmable through a delay control input.

14. The method of claim 12, wherein delaying the local clock signal using the delay line further comprises delaying the local clock signal using a fixed delay line.

15. The method of claim 12, wherein delaying the local clock signal using the delay line further comprises delaying the local clock signal using the delay line such that the delayed local clock signal is delayed relative to the local clock signal by one half of a period of the local clock signal.

16. The method of claim 12, wherein delaying the local clock signal using the delay line further comprises delaying the local clock signal using the delay line such that the delayed local clock signal is delayed relative to the local clock signal by an amount which causes write data at the data input of the memory device to transition in a middle of a stable region of the clock strobe at the clock strobe input of the memory device.

17. The method of claim 12, wherein delaying the local clock signal using the delay line further comprises delaying the local clock signal using the delay line such that the delayed local clock signal is delayed relative to the local clock signal by an amount which optimizes placement of transitions of the clock strobe signal with respect to transitions in the write data to meet setup and hold time requirements at the memory device.

18. The method of claim 12, and further comprising clocking a second latch circuit with the second one of the local clock signal and the delayed local clock signal to provide write data to an input of the first latch circuit.

19. The method of claim 12, wherein clocking the first latch circuit and clocking the strobe generating circuit further comprise clocking the first latch circuit with the delayed local clock signal and clocking the clock strobe generating circuit with the local clock signal to thereby delay the write data provided to the memory device relative to the clock strobe signal provided to the memory device.

20. The method of claim 12, wherein clocking the first latch circuit and clocking the strobe generating circuit further comprise clocking the first latch circuit with the local clock signal and clocking the clock strobe generating circuit with the delayed local clock signal to thereby delay the clock strobe signal provided to the memory device relative to the write data provided to the memory device.

* * * * *